United States Patent
Hovel et al.

(10) Patent No.: US 8,294,027 B2
(45) Date of Patent: Oct. 23, 2012

(54) EFFICIENCY IN ANTIREFLECTIVE COATING LAYERS FOR SOLAR CELLS

(75) Inventors: Harold J. Hovel, Yorktown Heights, NY (US); Rainer K. Krause, Mainz (DE); Zhengwen Li, Danbury, CT (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 242 days.

(21) Appl. No.: 12/689,464

(22) Filed: Jan. 19, 2010

(65) Prior Publication Data

US 2011/0174369 A1 Jul. 21, 2011

(51) Int. Cl.
*H01L 31/04* (2006.01)
*B05D 5/12* (2006.01)

(52) U.S. Cl. ......... 136/256; 136/255; 136/252; 438/72; 438/94; 438/98; 438/57; 427/74

(58) Field of Classification Search ................ 136/255, 136/256, 252; 438/72, 94, 98, 57; 427/74
See application file for complete search history.

(56) References Cited

U.S. PATENT DOCUMENTS

| | | | |
|---|---|---|---|
| 4,163,678 A | | 8/1979 | Bube |
| 4,171,989 A * | 10/1979 | Pryor | 136/256 |
| 4,200,473 A * | 4/1980 | Carlson | 136/255 |
| 4,278,704 A * | 7/1981 | Williams | 438/98 |
| 4,355,196 A * | 10/1982 | Chai | 136/259 |
| 4,643,913 A * | 2/1987 | Okunaka et al. | 438/72 |
| 4,694,115 A * | 9/1987 | Lillington et al. | 136/256 |
| 5,011,565 A * | 4/1991 | Dube et al. | 438/98 |
| 5,279,682 A * | 1/1994 | Wald et al. | 136/256 |
| 5,320,684 A * | 6/1994 | Amick et al. | 136/256 |
| 5,698,451 A | 12/1997 | Hanoka | |
| 5,726,065 A * | 3/1998 | Szlufcik et al. | 438/57 |
| 6,146,483 A * | 11/2000 | Hanoka et al. | 156/182 |
| 6,206,996 B1 * | 3/2001 | Hanoka et al. | 156/230 |
| 6,278,053 B1 * | 8/2001 | Hanoka et al. | 136/256 |
| 6,479,316 B1 * | 11/2002 | Hanoka et al. | 438/72 |
| 6,552,414 B1 * | 4/2003 | Horzel et al. | 257/655 |
| 6,979,903 B1 | 12/2005 | Avanzino et al. | |
| 2004/0112426 A1 * | 6/2004 | Hagino | 136/261 |
| 2005/0252544 A1 * | 11/2005 | Rohatgi et al. | 136/262 |
| 2006/0231800 A1 * | 10/2006 | Wang et al. | 252/500 |
| 2008/0000521 A1 * | 1/2008 | Sivoththaman et al. | 136/254 |
| 2008/0072959 A1 * | 3/2008 | Chen et al. | 136/257 |
| 2008/0210303 A1 * | 9/2008 | Lu et al. | 136/260 |
| 2008/0302412 A1 * | 12/2008 | Chen et al. | 136/252 |
| 2009/0133742 A1 * | 5/2009 | Liu et al. | 136/252 |
| 2009/0165855 A1 * | 7/2009 | Sun et al. | 136/261 |
| 2010/0024880 A1 * | 2/2010 | Lee | 136/256 |
| 2010/0078068 A1 * | 4/2010 | Yang | 136/256 |

FOREIGN PATENT DOCUMENTS

JP 2006-319170 11/2006

* cited by examiner

*Primary Examiner* — Jonathan Johnson
*Assistant Examiner* — Golam Mowla
(74) *Attorney, Agent, or Firm* — Cantor Colburn LLP; Yuanmin Cai

(57) ABSTRACT

A method for fabricating a cell structure includes doping a substrate to form a N-region and a P-region, disposing a first anti-reflective layer on the substrate, disposing a metallic contact paste on the first anti-reflective layer, drying the metallic contact paste to form contacts, disposing a second anti-reflective layer on the first anti-reflective layer and the metallic contacts, and heating the cell structure, wherein heating the cell structure results in metallic contact material penetrating the first anti-reflective layer and contacting the substrate.

17 Claims, 5 Drawing Sheets

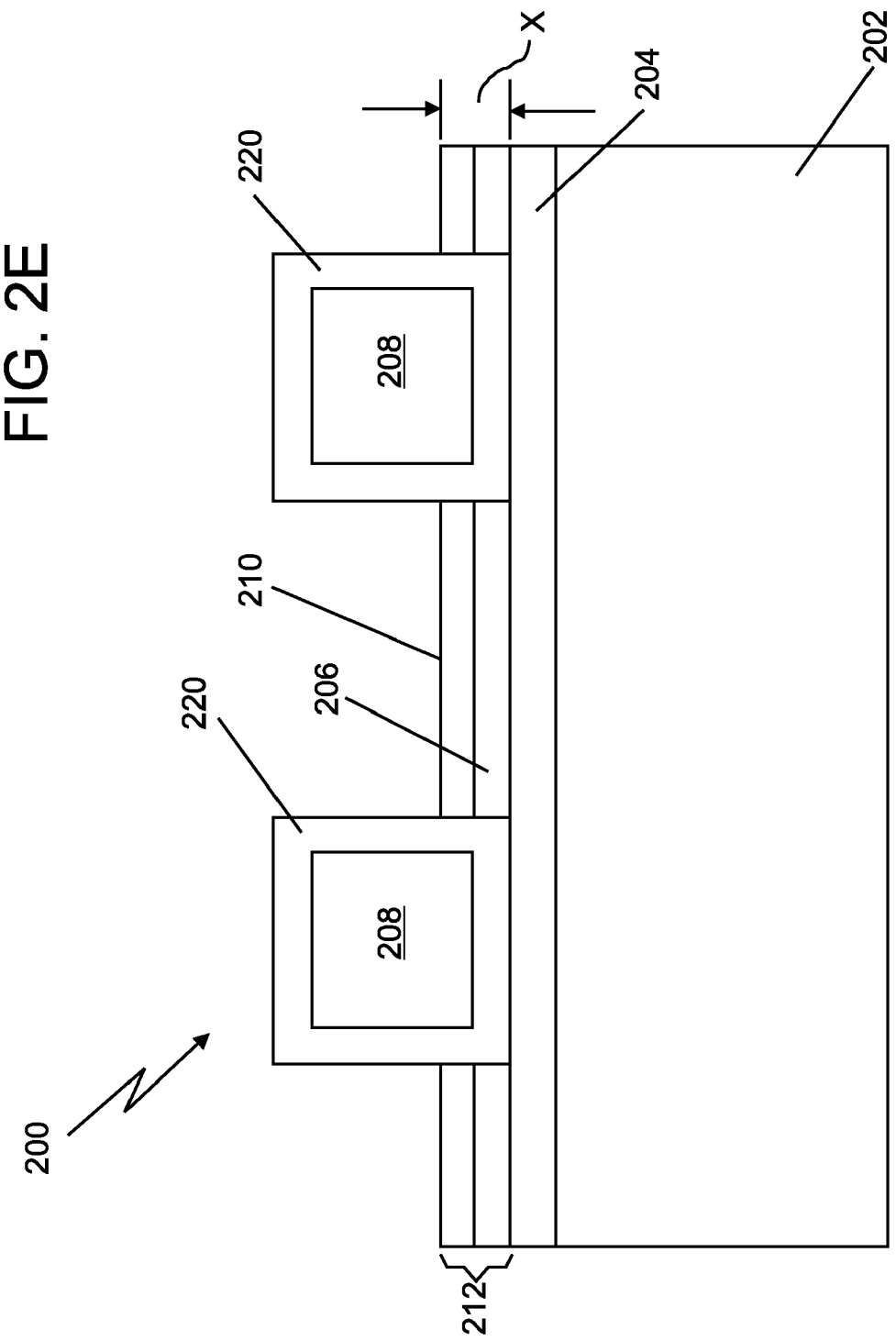

US 8,294,027 B2

EFFICIENCY IN ANTIREFLECTIVE COATING LAYERS FOR SOLAR CELLS

BACKGROUND

The present invention relates to solar cells, and more specifically, to a method and resultant structure that improves the efficiency of fabricating solar cells.

Solar cells are fabricated using a number of processes. For example, an annealing process is often used to create a metallic contact grid that contacts doped regions of a cell substrate. During manufacturing, the annealing process allows the metal of the contact grid, initially formed on top of an anti-reflective coating layer, to diffuse through the anti-reflective coating layer and come in contact with the underneath cell substrate. The annealing process typically includes heating the cell components for a time period that is affected and/or dictated by the thickness of the anti-reflective coating layer.

BRIEF SUMMARY

According to one embodiment of the present invention, a method for fabricating a cell structure includes doping a substrate to form a N-region and a P-region, disposing a first anti-reflective layer on the substrate, disposing a metallic contact paste on the first anti-reflective layer, drying the metallic contact paste to form contacts, disposing a second anti-reflective layer on the first anti-reflective layer and the metallic contacts, and heating the cell structure, wherein heating the cell structure results in metallic contact material penetrating the first anti-reflective layer and contacting the substrate.

According to another embodiment of the present invention, a solar cell includes a substrate having an N-region and a P-region, a first anti-reflective layer disposed on the substrate, a metallic contact disposed on the first anti-reflective layer, a second anti-reflective layer disposed on the first anti-reflective layer and the metallic contact, and a region partially defined by the first anti-reflective layer and the second anti-reflective layer having diffused metallic contact material operative to form a conductive path to the substrate through the first anti-reflective layer, the metallic contact, and the second anti-reflective layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2A-2F illustrate a cross-sectional view of an exemplary fabrication method of the cell structure of FIG. 1 according to one embodiment of present invention.

DETAILED DESCRIPTION

Figure 1:
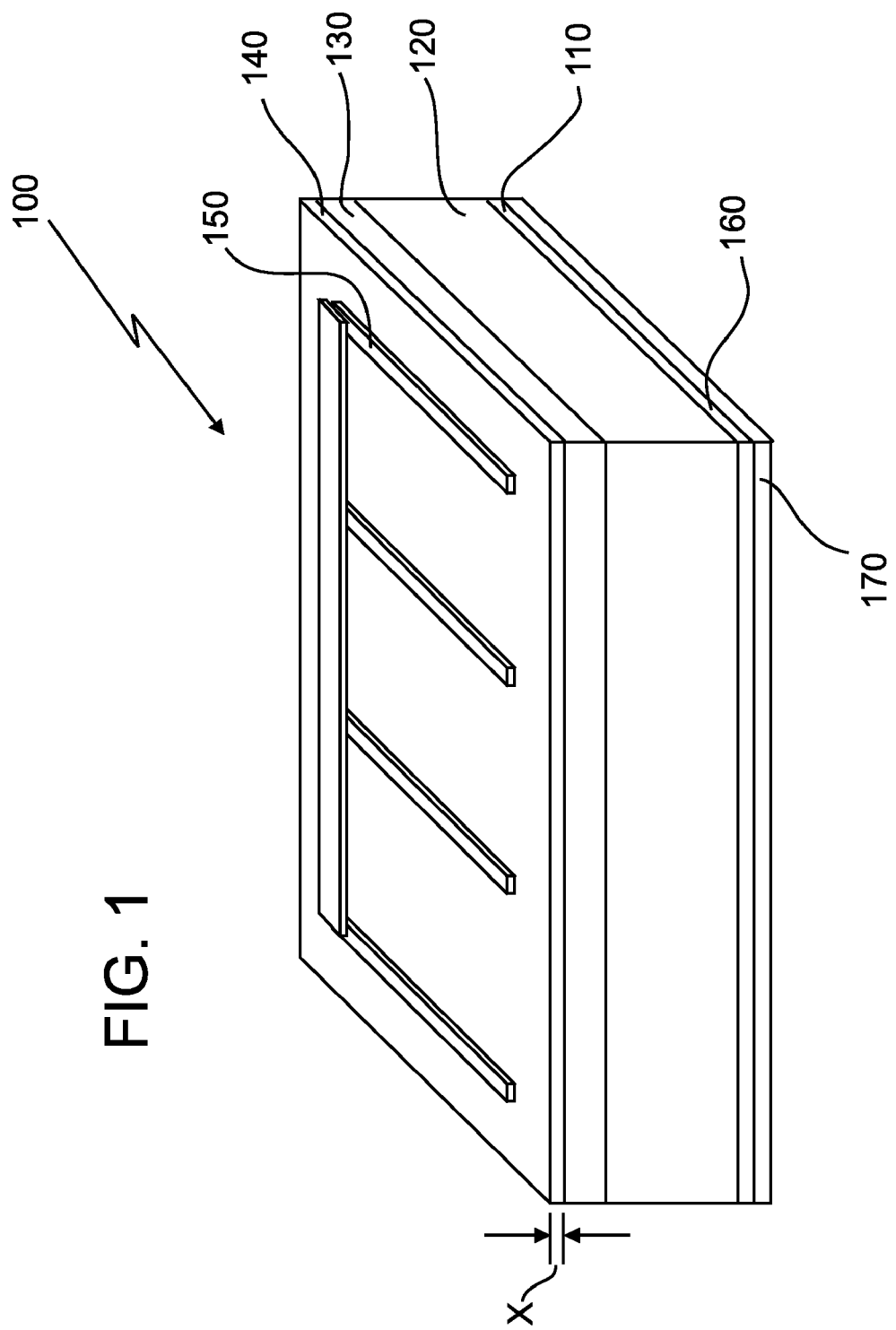
FIG. 1 illustrates a perspective view of an exemplary embodiment of a cell structure according to present invention.

FIG. 1 illustrates an exemplary embodiment of a cell structure 100 having a substrate with a doped P++ region 110, a P− region 120, and an N++ region 130. An anti-reflective coating layer 140 (AR) is disposed on the substrate on top of N++ region 130, contacts 150 are arranged in a grid via AR layer 140 and in contact with the region 130. P++ region 110 has a back surface field 160 and bottom contacts 170 are arranged on the back surface field 160.

In a conventional fabrication process of fabricating solar cells, which may create a structure of solar cell similar but not identical to the one shown in FIG. 1, an AR layer, similar to AR layer 140, is disposed on a cell substrate at a thickness x with the thickness x meeting the designed specifications for the desired anti-reflective properties of the solar cell structure. A silver paste (Ag) is then disposed on the AR layer to define a contact grid similar to the contacts 150. Once the Ag paste dries, the structure is subjected to a high temperature annealing process of approximately 900 degrees C. for typically over one hour. The annealing process causes the Ag paste to diffuse or penetrate the AR layer underneath and contact the region below, and in the meantime remain at least partially exposed on the top for electrical connections. Generally, the time of annealing may be calculated by the equation $t1=(AR\ layer\ thickness)^2/D$, where D is a coefficient value determined by various other factors. The thickness, which may be denoted by x, is a factor in determining the duration of the annealing process in that a greater x results in a greater annealing process time t1, depending on the actual thickness of the AR layer. The exemplary methods described below reduce the annealing process time t.

Figure 2A:
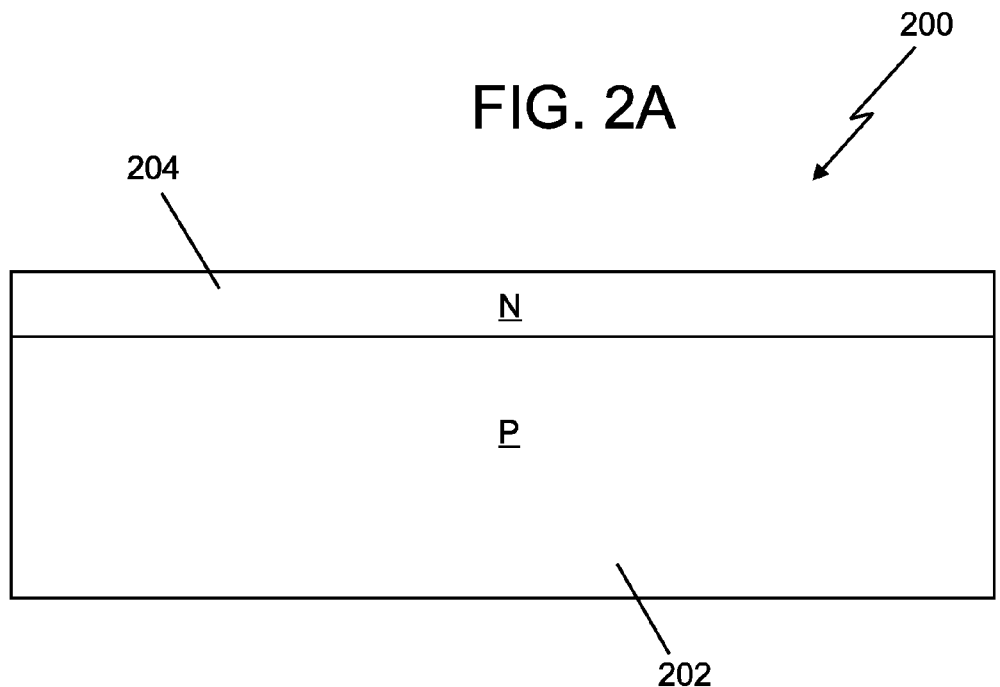

FIGS. 2A-2F illustrate a cross-sectional view of an exemplary fabrication method of a cell structure 200 according to one embodiment of present invention. Referring to FIG. 2A, a p-type silicon substrate 202 is doped to form an N region 204. The N region may be an N+ region in alternate embodiments, while the p-type substrate 202 may include P− and/or P++ regions.

Figure 2B:
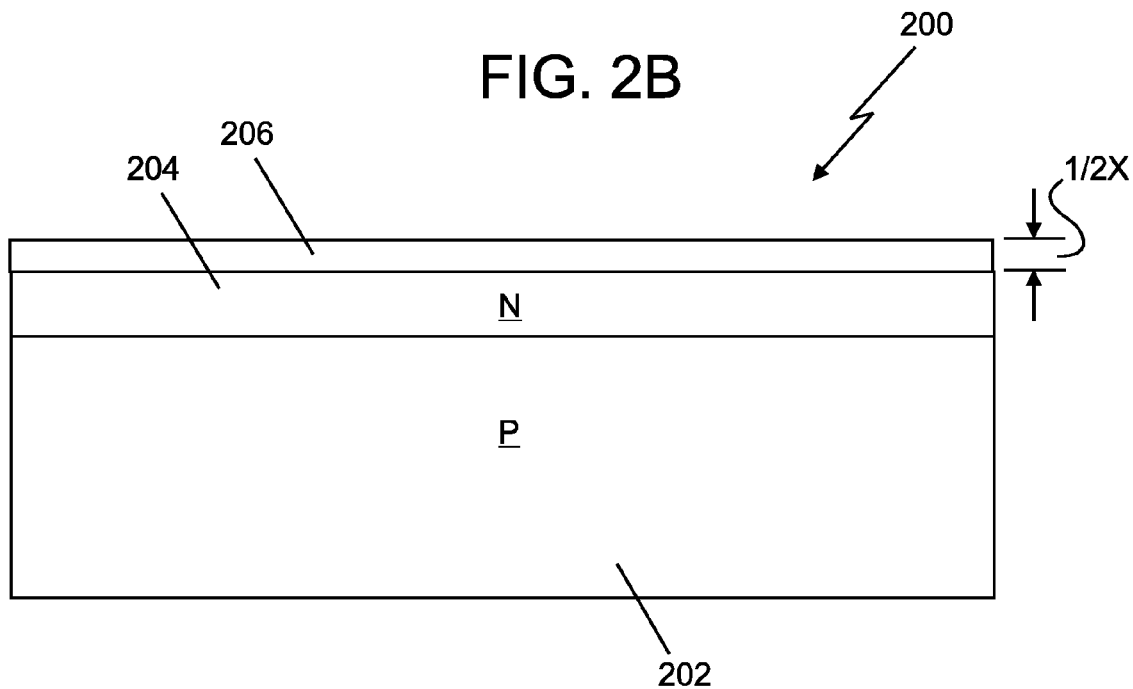

Referring to FIG. 2B, a first anti-reflective coating layer 206 (AR layer) is disposed on the N region 204. The first anti-reflective coating layer 206 may include for example, a dielectric layer of silicon nitride ($SiN_y$), a silicon oxide ($SiO_y$)/$SiN_y$ combination, or other suitable materials. The first AR layer 206 may be deposited to have a thickness less than the total desired thickness x of the AR layer for the completed cell structure 200. The total desired thickness x is, for example, between 50 and 100 nm, and is uniquely dependant on, and determined by the refractive index of the AR layer, for example, some factors such as the wavelength of light applied to the solar cell may interact. In one embodiment, for example, the first AR layer 206 may have a thickness of about half the thickness x, that is, ½x. However, embodiments of the present invention may include other thickness as well, that are larger or smaller than ½x.

Figure 2C:
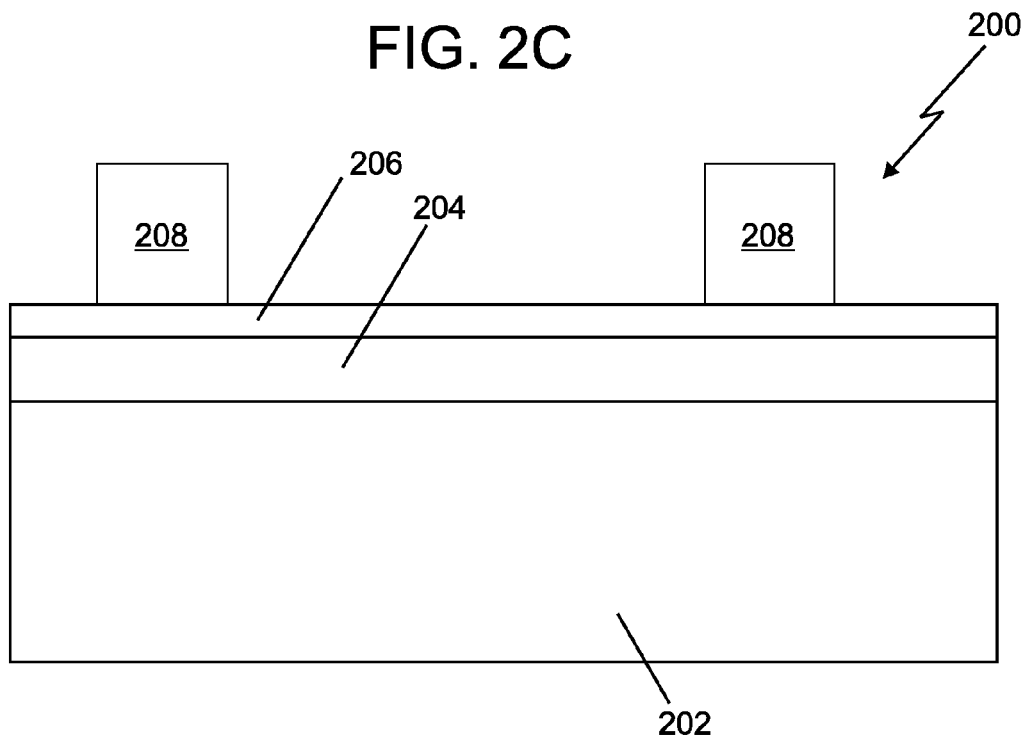

Referring to FIG. 2C, Ag paste or other types of paste that are suitable for making contacts for cell structure 200 is disposed on the first AR layer 206 by, for example, a lithographic patterning and deposition process, and dried to define contacts 208. The paste is disposed on the AR layer 206, instead of directly on top of N region 204, to avoid contamination of the N region 204 in the deposition process.

Figure 2D:
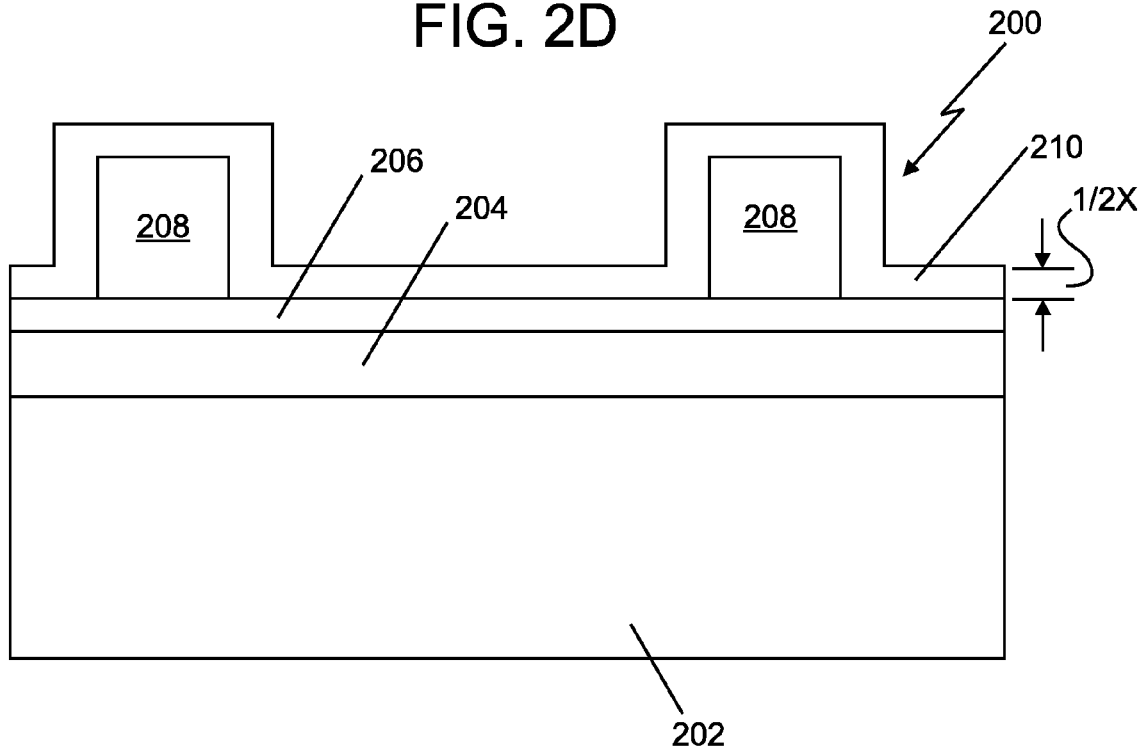

Referring to FIG. 2D, a second AR layer 210 is disposed on the first AR layer 206 and the contacts 208. The second AR layer 210 may have a thickness which, when being combined together with the thickness of the first AR layer 206, may provide the desired total thickness x, to function as a single AR layer, for the completed cell structure 200. For example, in one embodiment when the first AR layer 206 has a thickness of ½x, the second AR layer 210 may have a thickness ½x as well to make a total thickness x of AR layers.

Referring to FIG. 2E, the structure 200 is heated in an annealing process. The annealing process includes heating the structure to approximately 900 degrees C. or any other suitable temperatures for a time duration t2. According to one embodiment of the present invention, since contacts 208 need to be in contact with N region 204 and also be exposed on the top for electrical connection, the annealing may be determined by the larger of time needed to diffuse both first AR layer 206 and second AR layer 210, and may be calculated by the equation $t2=(\text{layer thickness})^2/D$, where D is a coefficient value determined by various other factors. In the above illustrated embodiment, the time t2 of annealing maybe reduced, compared to t1, by making the thickness of first AR layer 206 approximately the same as that of second AR layer 210, both being equal to approximately ½x. Other combinations of thicknesses are also possible, although the reduction in time of annealing will be less. Based upon the above equation, the time t2 for annealing first AR layer 206 (and second AR layer 210) with a thickness of ½x is approximately ¼ of the time t1 that will otherwise be required to anneal an AR layer of thickness x. The annealing process results in contact 208 material diffusing or penetrating through the first AR layer 206 to contact the N region 204, and penetrating through the second AR layer 210 in the regions above the contacts 208. Since contact 208 material diffuses into surrounding AR layers, the size of contacts 208 becomes larger, resulting in outer regions 220 of dielectric material, having contact 208 material being diffused therein, that promotes electrical conductivity, as shown in FIG. 2E. A resultant AR layer 212 comprising the first AR layer 206 and the second AR layer 210 having a combined thickness x is also shown in FIG. 2E. In the illustrated embodiment, the first and second AR layers 206 and 210 are about the same thickness, however other embodiments may include combinations of AR layers having different thickness (e.g., ¼x and ¾x) above and below contacts 208. Although such an arrangement would still reduce the time t2 for annealing as discussed above, AR layers with similar thicknesses offer an even larger reduction in annealing time t2.

Figure 2F:
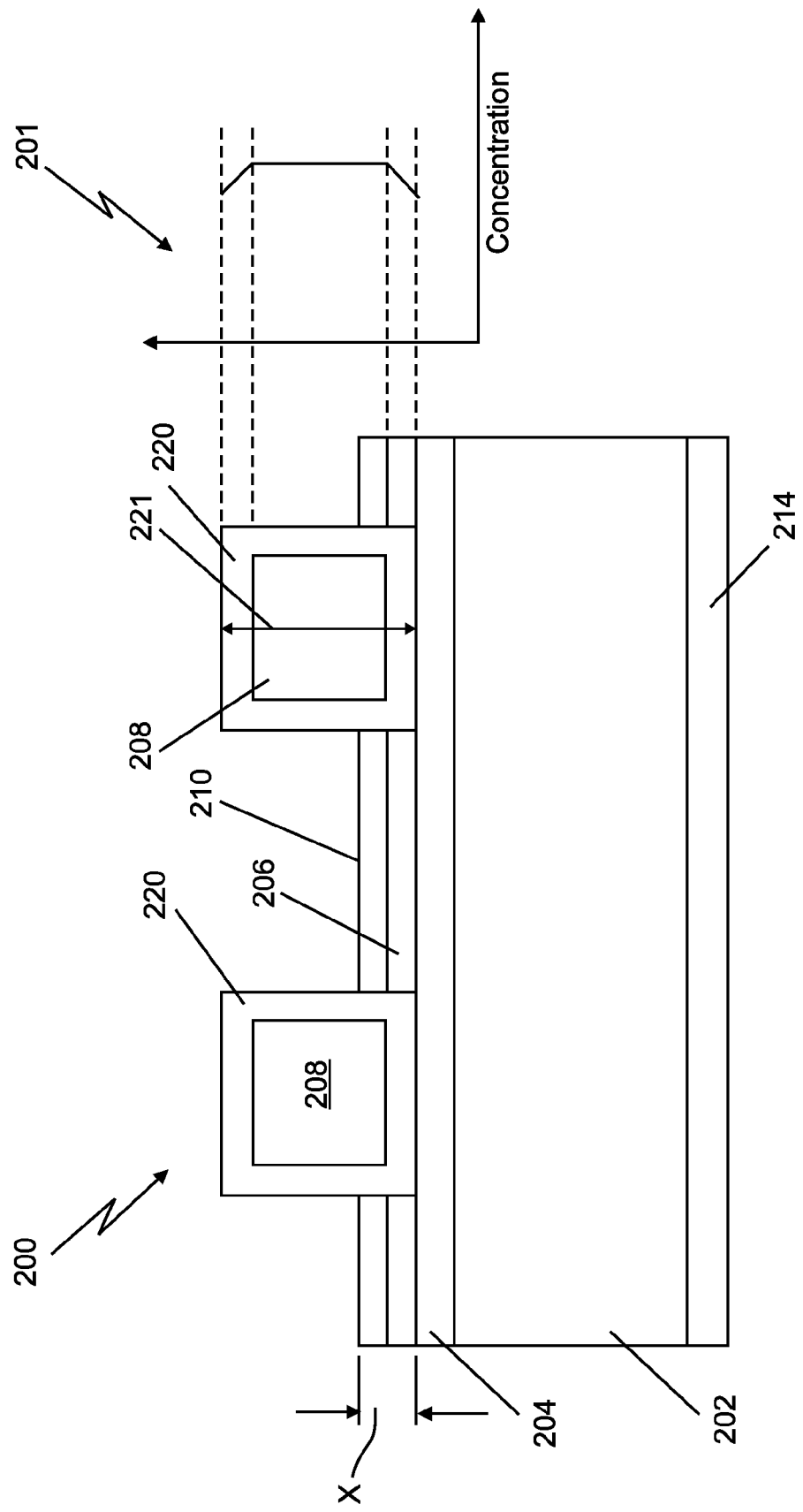

Referring to FIG. 2F, a back side contact 214 is formed on the underside of the p-type silicon substrate 202. The graph 201 illustrates the concentration gradient of contact material in the regions 220. A slight diffusion of the contact material is also present in the N region 204, which promotes electrical contact with the N region 204. The arrow 221 illustrates an example of a conductive path including the region 220 through the second anti-reflective layer 210; the contact material 208; and the region 220 through the first anti-reflective layer 206, which contacts the N-region 204 of the substrate.

The embodiments illustrated above include the deposition of two AR layers; however, other embodiments may include the deposition of a plurality of AR layers that will result in a resultant AR layer 212 having a thickness x.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a cell structure comprising:
doping a substrate to form a N-region and a P-region;
disposing a first anti-reflective layer on the substrate;
disposing a metallic contact paste on the first anti-reflective layer;
drying the metallic contact paste to form metallic contacts;
disposing a second anti-reflective layer on the first anti-reflective layer and the metallic contacts; and
heating the cell structure, to cause material of the metallic contacts to penetrate the first anti-reflective layer and contact the substrate, and diffuse material of the metallic contacts into a region of the second anti-reflective layer.

2. The method of claim 1, wherein the heating the cell structure further results in the first and second anti-reflective layers in forming a single resultant anti-reflective layer.

3. The method of claim 2, wherein the single resultant anti-reflective layer has a thickness x of between 50 and 100 nanometers.

4. The method of claim 3, wherein the first anti-reflective layer has a thickness of ½x.

5. The method of claim 3, wherein the second anti-reflective layer has a thickness of ½x.

6. The method of claim 1, wherein the first anti-reflective layer is made of a dielectric material.

7. The method of claim 1, wherein the second anti-reflective layer is made of a dielectric material.

8. The method of claim 1, wherein the metallic contact paste is a silver (Ag) paste.

9. A method for fabricating a cell structure comprising:
doping a substrate to form a N-region and a P-region;
disposing a first anti-reflective layer on the substrate;
disposing a metallic contact paste on the first anti-reflective layer;
drying the metallic contact paste to form metallic contacts;
disposing a second anti-reflective layer on the first anti-reflective layer and the metallic contacts; and
heating the cell structure, following the disposing the second anti-reflective layer, to cause material of the metallic contacts to penetrate the first anti-reflective layer and contact the substrate.

10. The method of claim 9, wherein the heating the cell structure further results in diffusing material of the metallic contacts into a region of the second anti-reflective layer.

11. The method of claim 9, wherein the heating the cell structure further results in the first and second anti-reflective layers in forming a single resultant anti-reflective layer.

12. The method of claim 11, wherein the single resultant anti-reflective layer has a thickness x of between 50 and 100 nanometers.

13. The method of claim 12, wherein the first anti-reflective layer has a thickness of ½x.

14. The method of claim 12, wherein the second anti-reflective layer has a thickness of ½x.

15. The method of claim 9, wherein the first anti-reflective layer is made of a dielectric material.

16. The method of claim 9, wherein the second anti-reflective layer is made of a dielectric material.

17. The method of claim 9, wherein the metallic contact paste is a silver (Ag) paste.

* * * * *